United States Patent [19]

Aurichio et al.

[11] Patent Number: 4,761,335
[45] Date of Patent: Aug. 2, 1988

[54] ALPHA-PARTICLE PROTECTION OF SEMICONDUCTOR DEVICES

[75] Inventors: Joseph A. Aurichio; Paul D. Fisher, both of Anderson, S.C.

[73] Assignee: National Starch and Chemical Corporation, Bridgewater, N.J.

[21] Appl. No.: 708,999

[22] Filed: Mar. 7, 1985

[51] Int. Cl.$^4$ ............ C09J 7/02; H05K 1/00; H01L 23/28
[52] U.S. Cl. .................................. 428/352; 428/414; 428/448; 428/473.5; 428/353; 428/354; 428/901; 174/68.5
[58] Field of Search ............ 428/473.5, 352, 353, 428/354, 910; 488/901

[56] References Cited

U.S. PATENT DOCUMENTS

| | | | |
|---|---|---|---|
| 3,565,743 | 2/1971 | Kallenberg et al. | 428/251 |
| 4,380,566 | 4/1983 | Phy | 428/192 |
| 4,543,295 | 9/1985 | St. Clair et al. | 428/473.5 |
| 4,653,175 | 3/1987 | Brueggeman et al. | 29/574 |

FOREIGN PATENT DOCUMENTS

| | | |
|---|---|---|
| 34455 | 8/1981 | European Pat. Off. |
| 55-130149 | 10/1980 | Japan. |
| 55-140250 | 11/1980 | Japan. |
| 56-94650 | 7/1981 | Japan. |
| 2067013 | 7/1981 | United Kingdom. |

Primary Examiner—P. C. Ives

[57] ABSTRACT

The present invention is a tape product suitable for use in the protection of semiconductor devices from alpha-particles. The product comprises a heat resistant support film, a pressure sensitive adhesive layer on one side of the support film, a least one alpha-particle protector member formed of a plastic material capable of protecting the semiconductor device releasably supported on the pressure sensitive adhesive, and a layer of heat resistant adhesive bonded to the plastic material on its side lying opposite to the side bonded to the pressure sensitive adhesive. Preferably, a primer layer lies between the heat resistant support film on the pressure sensitive adhesive to insure that clean removal of the support film and pressure sensitive adhesive from the surface of the alpha-particle protector member. In order to aid in this removal the surface of the alpha-particle protector member facing the pressure sensitive layer is also coated with a release coating. The product is used by bonding the heat resistant adhesive side of the transfer tape product to one or more die patterns on a semiconductor wafer and by then stripping the support film and pressure sensitive adhesive from the top surface of the applique after the applique.

8 Claims, 1 Drawing Sheet

ALPHA-PARTICLE PROTECTION OF SEMICONDUCTOR DEVICES

FIELD OF THE INVENTION

The present invention relates to a product useful for the alpha-particle protection of semiconductor devices, e.g., electronic memory devices.

DESCRIPTION OF THE PRIOR ART

There is presently a concern about the impact of alpha-particles on cells of VLSI (very large scale integrated) circuits. As VLSI circuits have become more complicated, the density of the circuits has increased and the junction depth has decreased, particularly in memory devices. These factors make VLSI die more sensitive to static electricity or to alpha-particles. Alpha-particles are believed to originate from trace amounts of thorium or uranium in either the plastic or ceramic materials used to package individual die. The problem manifests itself as a "soft" error in the device, i.e, a partial voltage state change in a particular gate causing a data error in the system. As VLSI circuitry shrinks, more devices are made susceptible to such "soft" errors. This includes not only memory devices but also microprocessors and larger devices as well.

Early attempts to achieve protection involve the use of a liquid polyimide resin such as PYRALIN polyimide resin from DuPont. In the beginning, this approach did not work because the polyimide had a higher alpha-particle emission than the materials used in packaging the die which was to be protected.

Currently, there are several approaches to alpha-particle protection. One involves the spin coating of liquid polyimide resin onto the die with the drying, curing and etching of the polyimide selectively to expose bonding sites on the surface of the die. Another involves screen printing of liquid polyimide onto the bonding sites and thus does not require subtractive etching. Another involves applying drops of polyimide to the central area of the individual die. Yet another method involves designing redundancy into the chip architecture in such a way that the device corrects itself from any soft errors caused by alpha-particle bombardment. Yet another approach involves purifying the packaging materials, particularly the polymeric molding compounds, to remove the trace contaminants.

Each of the above-mentioned approaches has certain drawbacks. The spin coating technique wastes expensive resin, and it is difficult to clean up the excess. Etching of polyimide selectively involves the use of a screen with a plasma or with application of a photoresist which must be imaged and developed prior to etching. The screen printing approach is very difficult to use with smaller die since the resolution limits of that technique approach the resolution needed for the pattern. Again, dealing with a liquid resin results in waste and clean-up problems. Application of drops of polyimide to the central area of the individual die also has certain problems. When drops of polyimide resin are applied, they assume a hemispherical shape on the die so that the outer perimeter of the applied resin thins out and does not afford the same degree of protection that the central and thicker area affords. The adding of redundant circuits to solve the problem requires that they be designed into the integrated circuit architecture at the initial stage since they cannot be added later. Redundant circuits also decrease the total area available on the integrated circuit for functional circuits. Finally, while molding materials and ceramic packages are purified to a much greater extent at the present time than in earlier days, there are still sufficient impurities in such materials to cause "soft" errors, particularly as the density increases and the patterns become finer in the integrated circuits adjacent to such materials.

U.S. Pat. No. 4,380,566 to William S. Phy describes radiation protection for integrated circuits utilizing tape automatic bonding. The central portion of a radiation resistant insulating material upon which electrically conductive leads are disposed is positioned in proximity to the integrated circuit die. When the leads are electrically connected to the integrated circuit, the central portion of the substrate is allowed to remain over the integrated circuit to protect that circuit. The Phy patent indicates that the central portion of protective material can "contact" the surface of the die but it does suggest an adhesive attachment of the protection to the die. The Phy patent also advocates that the alpha-particle protection article contain electrically conductive leads as an integral part thereof.

SUMMARY OF THE PRESENT INVENTION

The present invention is a transfer tape product for the protection of semiconductor devices from alpha-particles. The product comprises a heat resistant support film, a pressure sensitive adhesive layer on one side of the support film, at least one alpha-particle protective member formed of a plastic material bonded to the pressure sensitive adhesive, and a layer of heat resistant adhesive bonded to the plastic material on the side lynch opposite to the side bonded to the pressure sensitive adhesive. This layer of heat resistant adhesive allows for bonding of the member to the semiconductor device to be protected from the alpha-particles. Unlike the article described in U.S. Pat. No. 4,380,566, the article contemplated by the present invention does not contain electrically conductive leads as an integral part thereof.

DESCRIPTION OF THE DRAWINGS

The present invention is further illustrated by the Drawings which form a portion of the present Specification wherein.

DETAILED DESCRIPTION OF THE PRESENT INVENTION

Figure 1:
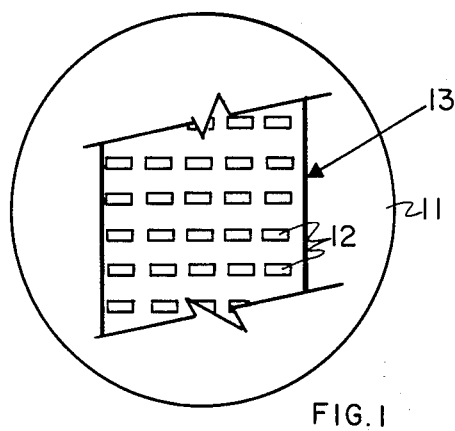
FIG. 1 represents an overhead view showing the transfer tape product of the present invention with discrete appliques of a protective plastic material bonded to the die positions on a semiconductor wafer.

As shown in FIG. 1, the present invention is useful for adhesively placing appliques of a plastic protection material over the dies on a semiconductor wafer. In FIG. 1, the numeral 11 represents the uncut semiconductor wafer which carries a plurality of dies (not shown) over which each of the appliques 12 is adapted to fit. The appliques are carried by the tape product of the present invention, the outlines of a portion of which are shown by reference numeral 13.

Figure 2:
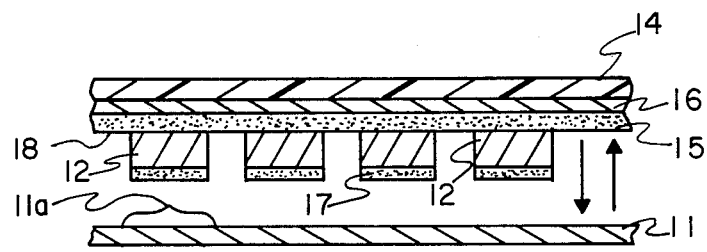
FIG. 2 is a side view showing the application of the tape product of the present invention to a semiconductor wafer tobond appliques to the semiconductor die sites on a semiconductor wafer to give the product shown in FIG. 1.
Figure 3:
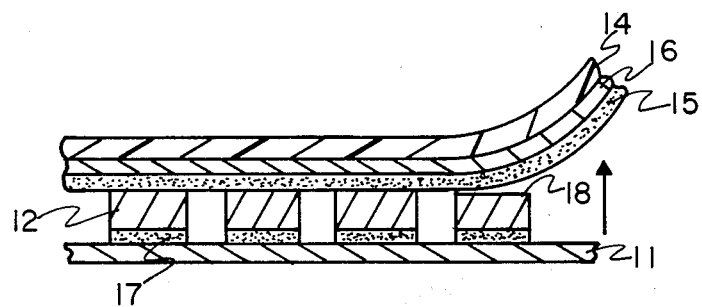
FIG. 3 represents the stripping of the support film and adherent adhesive layer from the top surface of the appliques after the appliques have been bonded to the die sites on the semiconductor wafer.

FIGS. 2 and 3 show the product of the present invention in greater detail. In FIG. 2, reference numeral 11a indicates the portion of the wafer 11 which is occupied by the integrated circuit pattern. This circuit pattern forms at least a major portion (or, if desired, substantially the entire portion) of the die which is to be protected. The product of the present invention comprises a support film 14, an adherent pressure sensitive adhesive layer 15 which preferably is bonded to support film 14 by means of a primer layer 16. Appliques 12 of a polymeric material designed to protect the die from alpha-particle damage are attached to the pressure sensitive adhesive 15. A high temperature adhesive 17 is contained on the surface of the applique 12 which is adapted to be brought into contact with wafer 11. This surface lies opposite the surface of the applique 12 adapted to be joined to support film 14. Preferably, a release coating 18 is placed on the surface of the applique which contacts the pressure sensitive adhesive 15. When the material forming support film 14 is of the same general type as that used for appliques 12, it is very desirable to have primer layer 16 and a release layer 18, as described hereinbefore, to provide the desired degree of differential release for the adhesive 15. In other words, when the support film 14 and pressure sensitive adhesive 15 are desired to be removed from the appliques 12, as shown in FIG. 3, the pressure sensitive adhesive layer 15 should be stripped from the appliques 12 and be removed with support film 14.

The support film 14 is preferably formed of a plastic material having a suitable degree of resistance to high temperature. Polyimide films are preferred. The reason for desiring a high temperature resistant film is to insure that the support film 14 will survive the activation step which is normally needed to activate high temperature adhesive 17 during the bonding step to die 11a prior to the removal of the support film 14 and adherent pressure sensitive adhesive 15 as shown in FIG. 3. Generally, the thickness of support film 14 can range anywhere from about 0.001 inch to about 0.005 inch. Since it is preferred to use the same type of high temperature resistant plastic material for support film 14 as well as appliques 12, it is most desirable to coat the surface of support film 14 which will be joined to pressure sensitive adhesive layer 15 with a suitable primer layer 16. The function of the primer layer is to insure that the pressure sensitive adhesive 15 preferentially bonds to the support film 14 when the support film/pressure sensitive adhesive subcomponent is being removed as shown in FIG. 3. Generally, primer layers of the following types can be used: polysiloxane (highly crosslinked), thermoplastic polyimide, or other materials which provide a more secure attachment of the pressure sensitive adhesive 15 to the support film 14.

The type of pressure sensitive adhesive that is used in the present invention is one which has generally low peel and low tack but a high shear and high cohesive strength. This type of formulation allows for the easy stripping of the adhesive from the surface of the appliques 12 lying opposite to the surfaces that are coated with the high temperature adhesive layer 17. The use of a high shear, high cohesive strength pressure sensitive adhesive insures that the physical integrity of this adhesive will remain when it is removed with the support film 14 from the surface of the applique(s). The desired result is the removal of the adhesive 15 without leaving a residual adhesive coating on the surfaces of the appliques 12. Generally, adhesives which have a peel strength of from about 1 to about 4 lbs. per linear inch are suitable. Representative types of adhesives which meet these requirements are the following: acrylic pressure sensitive adhesives which are known and conventionally used in the art and particularly those which are isocyanate-curable upon the application of heat. Polysiloxane pressure sensitive adhesives which are curable with peroxides can also be used. These types are preferable since their heat resistance is generally superior to the heat resistance of those pressure sensitive adhesives based on natural or synthetic rubber which have been modified with low thermal stability rosins or tackifying resins.

In order to insure the clean removal of the pressure sensitive adhesive 15 from the top surface of the applique 12, it is desired that a suitable release coating 18 be placed on that surface. Generally, release coatings of the following types are suitable: polysiloxane solutions which are lightly crosslinked, organo-titanates, or organosilanes.

The pressure sensitive adhesive 15, in the product of the present invention, carries a series of appliques 12 which conform to the configuration of the dies 11a on the semiconductor wafer 11. Each of these appliques is suitably dimensioned to fit over the section of the die 11a which is desired to be shielded from the alpha-particles. The appliques 12 are each formed from a suitable plastic material having a high degree of temperature resistance to survive such conventional semiconductor packaging steps as soldering of the leads, lid sealing, etc. Polyimide films available under the trademark KAPTON from DuPont, form a most preferred and suitable material. Generally, the thickness of the applique 12 can be anywhere from about 3 to about 5 mils.

The tape product shown in FIGS. 2 and 3 can be formed in the following manner. Initially, the support film 14 can be coated with primer, and the primer can be dried to form primer layer 16. The pressure sensitive adhesive can be coated onto the primer layer 16 and can be dried to form pressure sensitive adhesive layer 15. In order to form the other part of the transfer tape, a release coating 18 is applied to a heat resistant plastic film on one side thereof and a high temperature adhesive 17 is bonded to the other. The resulting release coated/plastic film/heat resistant adhesive laminate is then bonded (via its release coating) to the pressure sensitive adhesive layer 15 of the previously formed laminate. The resulting structure is then kiss cut through only the release coating, plastic film, and high temperature adhesive layers to form the appliques 12 of the desired shape from the plastic film carrying the high temperature adhesive and optional release coating.

The present invention is further illustrated by the Examples which follow.

EXAMPLE 1

Siloxane-modified polyamic acid resin in diglycol methyl ether solvent was applied as an adhesive to a 3 mil thick polyimide film (KAPTON brand film) with a #34 wire wound rod applicator to produce a deposit of 17.3 lbs/ream (about 0.001 in. thickness) on the film. When dried at 4 minutes and 85° C., the coated film was dry to the touch but cured excessively when subjected to a curing temperature of over 350° F. The coating produced a yellow, powdery residue.

Another application of siloxane-modified polyamic acid in solvent was applied under the same conditions but was subjected to sequential drying for 15 minutes each at 200° F., 275° F., 350° F., and 420° F. When bonded to a silicon wafer placed on a hot plate at 600° F. (316° C.) a good bond was achieved with no powdery residue.

This demonstrates that with a properly staged drying to remove solvent, a siloxane-modified polyamic acid adhesive can be used to adhere a polyimide film to a silicon wafer.

EXAMPLE 2

Solvents were added to the adhesive solution used in Example 1 to reduce the curl of the adhesive-coated film after drying. Solution A had 4% dimethylacetamide, based on resin solids, added. Solution B had 4% N-cyclohexylpyrollidone added to the solution used in Example 1.

Both solutions were cast onto 3 mil KAPTON polyimide film using a #34 wire wound rod applicator and were dried for 1 hour using the schedule cited in Example 1. Solution A had a somewhat reduced curl and a few bubbles in the coating. Solution B produced a coating which bubbled excessively when dried.

The pressure sensitive adhesive for the backing sheet was prepared by first priming a 2 mil KAPTON polymide film with the following solution using a #12 wire wound rod applicator.

| Ingredient | Amount* |
|---|---|
| Dimethyl polysiloxane(30% in toluene) (General Electric SS4191) | 10.0 |
| Polysiloxane accelerator(50% in toluene) (General Electric SS 4259C) | 0.5 |
| Polysiloxane catalyst(50% in toluene) (General Electric SS 4192C) | 0.5 |
| Hexane | 90.00 |

*All amounts are given in parts by weight.

The coated sheets were dried at 325° F. for thirty seconds.

Polysiloxane pressure sensitive adhesive (General Electric PSA 518), 100 parts by weight —56 parts by weight solids, was mixed with 1.1 parts by weight benzoyl peroxide and 50.0 parts by weight of toluene to yield a 37.8% solids composition. This pressure sensitive adhesive composition was coated onto the primed 2 mil KAPTON polyimide film with a #20 wire wound rod and was dried two minutes at 194° F. followed by two minutes drying at 329° F. The bond was 1.5 lbs/in. at 2 inches/min. and at 12 inches/min. separation rates when twice peeled at an angle of 180° on an INSTRON tensile tester and after laminating to a 3 mil thick KAPTON polyimide film.

This Example shows that the low peel strength of a high temperature resistant pressure sensitive adhesive can be achieved in order to prepare the supporting members for the die-cut appliques used in the present invention.

EXAMPLE 3

Primer formulations were made to be coated onto high temperature adhesive by mixing the ingredients listed below. The numbers set forth the parts by weight of the respective ingredients with the numbers in parenthesis setting forth the solids part by weight value.

| Ingredient | FORMULATION | | | | | | | | |
|---|---|---|---|---|---|---|---|---|---|
| | A | B | C | D | E | F | G | H | I |
| Epoxy cresol novolac resin (ECN 1299 brand)[1] | 37.5(18.8) | 14.9(7.5) | — | — | — | — | — | — | — |
| Epoxy cresol novolac resin (ECN 1235 brand)[2] | — | — | — | 37.5(18.8) | 14.9(7.5) | 64.3(32.1) | 54.6(27.3) | 47.3(23.7) | 40.7(20.4) |
| Polyimide resin (XU 218 brand)[3] | — | — | — | 62.5(18.8) | 74.3(27.3) | 35.7(10.7) | 30.3(9.1) | 26.3(7.9) | 22.6(6.8) |
| Multifunctional epoxy (XU276)[4] | — | — | — | — | — | — | 16.0(12.8) | 23.8(19.0) | 20.5(16.4) |
| NADIC METHYL ANHYDRIDE curing agent[5] | — | — | — | — | — | — | 12.0(12.0) | 10.4(10.4) | 9.0(9.0) |
| Polyimide-siloxane resin[6] | — | — | — | — | — | — | — | — | 0.4(0.4) |
| Imidazole[7] | — | — | — | — | — | — | — | — | 10.0(3.0) |

Footnotes:
[1]available from Ciba-Geigy (50% in xylene).
[2]available from Ciba-Geigy (50% in dimethylformamide).
[3]available from Ciba-Geigy (30% in dimethylformamide).
[4]available from Ciba-Geigy.
[5]methyl-bicyclo [2.2.1] heptene-2,3-dicarboxylic anhydride isomers.
[6]available from M & T Chemicals.
[7]NXJ-60 brand from Synthtron.

The formulations described above had the following solids contents:

| Formulation | Solids Content (wt %) |
|---|---|
| A | 37.6 |
| B | 33.4 |
| C | 50.0 |
| D | 37.6 |
| E | 33.4 |
| F | 42.8 |
| G | 54.2 |
| H | 56.6 |
| I | 63.0 |

Each formulation was cast onto a 2 mil KAPTON polyimide film with a #12 wire wound rod applicator and was dried 10 minutes at 93.3° C. Their adhesion to silicon wafers was checked by placing the film on the wafer heated to 392° F. with a hand held roller. Sample C was slightly tacky at room temperature since its melting point was 35° C. Samples exhibiting the best adhesion were those coated with Formulations C and I. When laminated to wafers in a platen press at 500° C. these two formulations both blackened severely even at 8 min. exposure.

By investigating the use of high temperature resistant primers which can be applied to the top of a siloxane-modified polyimide, it was hoped to increase the initial tack while lowering the application temperature so that press lamination of the adhesive-coated applique would be rendered unnecessary. Due to degradation of these primers at the temperatures where lid seal is to occur after the appliques have been applied to a silicon wafer, this approach was not feasible.

EXAMPLE 4

When 8% dimethylacetamide and 25% additional diglycol methyl ether solvent was added to siloxane-modified polyimide resin (M & T 4605-40), the shrinkage of the 0.75 mil coating was greatly reduced thereby allowing the coating gauge to be increased to 1.1 mils. After being coated onto 3 mil KAPTON polyimide film with a #50 wire wound rod applicator, the coating was dried for 15 minutes each at the following temperatures: 200° F., 275°, 350° and 420° F. The resulting coating was glossy and free of blisters with only slight curl. Double pass coatings with a #17 wire wound rod of the following release formulation was placed on the side of the KAPTON film opposite to the above coating:

| Ingredient | Parts by Weight |
| --- | --- |
| Dimethyl polysiloxane (General Electric SS 4191) | 10.5 |
| Polysiloxane accelerator (General Electric SS 4259C) | 1.5 |
| Polysiloxane catalyst (General Electric SS 4192C) | 1.5 |
| Hexane | 90.0 |
| Toluene | 20.0 |
| Fluorocarbon surfactant (3M FC 430) | 1.0 |

The toluene and surfactant were added to improve the wetting of the KAPTON film and to provide slower drying. The purpose of applying a silicone-based release coating to the opposite side of the 3 mil gauge KAPTON polyimide film (from a high temperature siloxane-modified polyimide resin) was to aid in clean release of the support film (2 mil KAPTON brand film) and its pressure sensitive adhesive after they have been bonded to the silicon wafer.

EXAMPLE 5

The following pressure sensitive adhesives were formed:

| Ingredient | A | B |
| --- | --- | --- |
| Polymethylphenylsiloxane adhesive (GE PSA 518) | 100(56.0) | 100(56.0) |
| Benzoyl peroxide in toluene (LUCIDOL 98 brand) | 51.7(1.7) | — |
| 2,4-dichlorobenzoyl peroxide (LUPERCO CST in Toluene) | — | 53.4(3.4) |

| Ingredient | C | D |
| --- | --- | --- |
| Polymethylphenylsiloxane resin solution (GE PSA 518) | 100(56.0) | — |
| Di-tert-butyl peroxide | 1.7(1.7) | — |
| Toluene | 50.0(0) | — |
| Polymethylphenylsiloxane resin solution (Dow-Corning 282) | — | 100(61.0) |
| Toluene | 51.8(1.8) | |

The above formulations were coated with a #20 wire wound rod onto 2 mil KAPTON film which had been previously primer coated with a solution formed by mixing:

| Ingredient | Amount By Weight |
| --- | --- |
| Dimethylpolysiloxane sol'n (GE SS 4191) | 10.0 |
| Polysiloxane accelerator (GE SS 4259C) | 0.5 |
| Polysiloxane catalyst (GE SS 4192C) | 0.5 |
| Hexane | 90.0 |

The primer had been coated on with a #12 wire wound rod applicator and the coated KAPTON film was dried 30 sec. at 330° F. After coating of the pressure sensitive adhesive on top of the primer the adhesive was dried for two min. at 210° F. and then for two minutes at 330° F. Samples were then bonded to 3 mil KAPTON coated, in certain cases, with a 2% solution of n-butyl titanate. One half of each bonded sample was subjected to heating at 525° F. for five minutes. The bond results are as follows:

| Sample | Adhesion*** (no heat/heated) |
| --- | --- |
| A | [.5*/.55**]/[.38*/.28**] |
| B | [.45*/.38**]/[.2°/.35**] |
| C | [.15*/.15**]/[.15*/−.5**] |
| D | [.6*/.45°**]/[.5*/.5**] |

*coated with titanate
**not coated with titanate
***the results are given in units of lbs./linear inch with the number before the slash mark representing those not heated to 525° F. and after the mark representing those heated to that temperature.

The only sample where the adhesive did not split and transfer to the KAPTON film was D where the 3 mil film had been coated with the titanate. On that sample it did not matter whether it had been exposed to the heating temperature or not.

These experiments relate to selection of a suitable combination of release agent on the top side of a 3 mil KAPTON polyimide film surface which will be in contact with a polysiloxane pressure sensitive adhesive and the appropriate primer on a 2 mil KAPTON brand support film. Since both films would be identical, except for gauge, the combination of primer on the support film and the release agent on the film designed to be the applique(s) was deemed important to keep the pressure sensitive adhesive from adhering to the top of the applique film following removal of the support film.

EXAMPLE 6

A number of sample sheets (8½ in. by 11 in.) were prepared by coating 2 mil KAPTON polyimide film with a primer solution using a #12 wire wound rod applicator. The primer had the following composition:

| Ingredient | Amount By Weight |
| --- | --- |
| Dimethyl polysiloxane (GE SS 4191) | 10.0(10.0) |
| Polysiloxane accelerator | 0.5(0.5) |

-continued

| Ingredient | Amount By Weight |
| --- | --- |
| (GE SS 4259C) Polysiloxane catalyst (GE SS 4192C) | 0.5(0.5) |
| Hexane | 90.0(—) |

The primer had 10.9% total solids content before application.

The coated film was then dried at 350° F. for 30 seconds. Onto the primed side of the 2 mil KAPTON film was applied a pressure sensitive adhesive layer with a #20 wire wound rod. The adhesive (41.4% solids) was formed from:

| Ingredient | Amount By Weight |
| --- | --- |
| Polymethylphenylsiloxane resin solution (Dow Corning 282) | 100.0(61.0) |
| Initiator (LUPERCO CST Brand*) | 51.8(1.8) |

*2,4-dichlorobenzoyl peroxide - 50% paste with silicone oil dissolved in toluene.

The coated KAPTON film was then dried for two minutes at 210° F.(99° C.) and for 2 minutes at 330° F.(166° C.)

The next step was to coat a 3 mil KAPTON film with the high temperature adhesive from Example 1. This mainly contained a polyimide/siloxane adhesive resin (M & T Chemicals 4605-40 brand) with an additional 20% by weight of 2-methoxyethyl ether solvent for making it more coatable. A #40 wire wound rod was used to achieve a coating (after drying) of about 1.0 mil. Drying was performed to achieve imidization of the film as well as solvent removal with the following cycle being used (each for 15 mins): 200° F.; 275° F.; 350° F.; and 420° F. When the coated KAPTON sheets were removed, the polyimide/siloxane coating was virtually indistinguishable from the uncoated KAPTON sheet.

To the opposite side of the sheet, a primer/release coating was applied which was a 2%, by weight, solution of n-butyl titanate in xylene. This was applied with a #12 wire wound rod and dried for four minutes at 210° F.(99° C.). When this coating was dry, the two types of KAPTON sheet were combined to produce the following construction: 1 mil adhesive/3 mil KAPTON sheet/0.1 mil release coating/1 mil pressure sensitive adhesive/0.1 mil primer coating/2 mil KAPTON sheet.

The 2 mil KAPTON sheet was removed and the 3 mil KAPTON sheet was die cut into a rectangular grid pattern on a Helms die cutter. These rectangles were bonded to a 3 in. silicon wafer by placing the following sandwich in a platen press:

stainless steel plate/nonwoven alumina press-packing (FIBERFRAX 970f(1/16")/ KAPTON construction/-wafer/FIBERFRAX/stainless steel plate The width of film used for die cutting was 1-3/32 in. The samples were cured at 600° F.(316° C.) for five minutes and cut at 70 lbs/in² pressure. The press was cooled to 200° F.(93° C.) before samples were removed. After removal, the rectangular appliques were firmly bonded to the silicon wafer. Both the FIBERFRAX material (a product of Carborundum Corporation) and the pressure sensitive adhesive transferred to the upper surface of the applique and wafer. These were easily removed by a toluene-soaked KIMWIPE towlette.

This shows that appliques can be cut from the 3 mil KAPTON brand film (with high temperature adhesive on one side and a release coating on the other side) and these can be bonded to the top surface of a silicon wafer using a platen press. It was desired that a 2 mil KAPTON brand support film (primed and coated with pressure sensitive adhesive) would hold the appliques in place during the bonding step but could be cleanly removed afterward. This was not the result since some pressure sensitive adhesive residue was transferred to the top side of the appliques/wafer configuration and had to be washed manually. However, the high temperature adhesive did adhere the appliques to the wafer very well and were held in place during the press-cure by the support film.

EXAMPLE 7

A thermoplastic polyimide-polyethersulfone copolymer in diglycol methyl ether solvent (LARC-TPI brand from Gulf) was coated onto a 3 mil KAPTON film at about a thickness of 1 mil as a dry film. It was dried for fifteen minutes at 212° F. (100° C.) to remove the solvent. The coated KAPTON film was then placed in an oven at 400° F. to determine if conversion of the polyamic acid to imide produces out-gassing. Some blistering was evident after fifteen minutes. The material was nearly tack-free after the 212° F. drying step and was completely tack-free after the 400° F. exposure.

Material that had not been subjected to the 400° F. oven drying was placed on top of one ounce electrodeposited copper foil and was cured in a platen press at 400° F. for one hour. The resulting laminate did not show adequate adhesion. Either the cure temperature should have been higher (e.g., 446°-464° F.) or residual solvent was present.

This Example is an early screening test for the suitable adhesive.

EXAMPLE 8

A removable pressure sensitive adhesive formulation (33% solids) was made by mixing the following ingredients:

| Ingredient | Weight Amount |
| --- | --- |
| Acrylic pressure sensitive adhesive (Monsanto RA 1151 brand) | 566 gm. |
| Polymethylene polyphenyl-isocyanate curing agent (PAPI 135 brand from Upjohn) | 4.9 gm. |
| 2-ethylhexoic acid salt of 1,8-diazo-bicyclo(5,4,0) undecene-7 (SA 102 brand from Abbott) | 1.7 gm. |

This adhesive was cast onto a 2 mil gauge polyethylene terephthalate film (MYLAR brand from duPont) with a #34 wire wound rod applicator. It was dried in an air circulating oven at 200° F. (93° C.) for three minutes. The pressure sensitive adhesive-coated film is adaptable for use on the reverse side of a 3 mil KAPTON polyimide support film.

The purpose of the adhesive (which was designed to crosslink and lose bond when subjected to heat) was to hold the KAPTON brand appliques in place during the bonding operation but to be removable without residue after bonding.

EXAMPLE 9

Thermoplastic polyimide adhesive (LARC-TPI brand from Gulf) was coated onto a 3 mil KAPTON polyimide film with a #18 wire wound rod. Drying of the coating to remove the diglycol methyl ether solvent and to pre-imidize the adhesive was performed in a stepwise fashion in an air circulating oven using the following heating sequence (each for 15 mins.): 200° F., 275° F., 350° F., and 420° F.

The coating was virtually defect-free, was hard, and was difficult to distinguish from the uncoated film. The gauge of the coating was 0.4 mil. Dipropylene glycol, methyl ether (ARCOSOLVE DPM from Arco) was found to be an effective diluent for viscosity reduction and for clean-up. Samples were prepared using the process described above (in the first paragraph). Two mil polyethylene terephthalate film was coated with removable pressure sensitive adhesive as described in Example 9 and was laminated to the uncoated side of the KAPTON film to result in the following construction for the sample:

0.4 mil polyimide adhesive (LARC-TPI) /3 mil KAPTON film/1 mil pressure sensitive adhesive/2.0 mil polyester terephthalate film The foregoing should merely be taken as descriptive of certain embodiments of the present invention and should not be construed in a limiting sense. The scope of protection sought is given in the claims which follow.

What we claim:

1. A transfer tape product to protect semiconductor devices from alpha-particles which comprises:
    (a) a support film;
    (b) a pressure sensitive adhesive layer on one side of the support film;
    (c) at least one alpha-particle protector member formed of a plastic material capable of protecting a semiconductor device from alpha particles when adhesively bonded to it, said member being releasably bonded to the side of the pressure sensitive adhesive layer (b) opposite to that side of the adhesive (b) which is bonded to the support film (a) and said protector member being of a configuration capable of protecting the semiconductor device from the alpha-particles; and
    (d) a layer of heat resistant adhesive bonded to the plastic material (c) on its side lying opposite to the side bonded to layer (b) to allow for bonding of the member (c) to the semiconductor device to be protected from the alpha-particles.

2. A tape product as claimed in claim 1 in which the support film is a polyimide film.

3. A tape product as claimed in claim 1 wherein a primer layer lies between the support film (a) and the pressure sensitive adhesive layer (b).

4. A tape product as claimed in claim 1 wherein a release layer lies between the pressure sensitive adhesive layer (b) and the alpha-particles protector member (c).

5. A tape product as claimed in claim 1 wherein a primer layer lies between support film (a) and adhesive layer (b) and a release layer lies between adhesive layer (b) and the alpha-particle protector member (c).

6. A tape product as claimed in claim 1 wherein the alpha-particle protector member is formed of polyimide resin.

7. A tape product as claimed in claim 1 wherein both the support film and the alpha-particle protector are polyimide.

8. A tape product as claimed in claim 7 wherein a primer layer lies between the support film (a) and the pressure sensitive adhesive (b).

* * * * *